OSCILLATOR

Filed May 20, 1950 2 SHEETS—SHEET 1

INVENTOR.
EMMERY J. H. BUSSARD
BY Alden D. Redfield
Charles M. Hogan
ATTORNEYS.

INVENTOR.
EMMERY J.H. BUSSARD
BY
Alden D. Redfield
Charles M. Logan
ATTORNEYS.

Patented Feb. 10, 1953 2,628,314

UNITED STATES PATENT OFFICE

2,628,314

OSCILLATOR

Emmery J. H. Bussard, Cincinnati, Ohio, assignor to Avco Manufacturing Corporation, Cincinnati, Ohio, a corporation of Delaware Application May 20, 1950, Serial No. 163,297

5 Claims. (Cl. 250—36)

Figure 1:
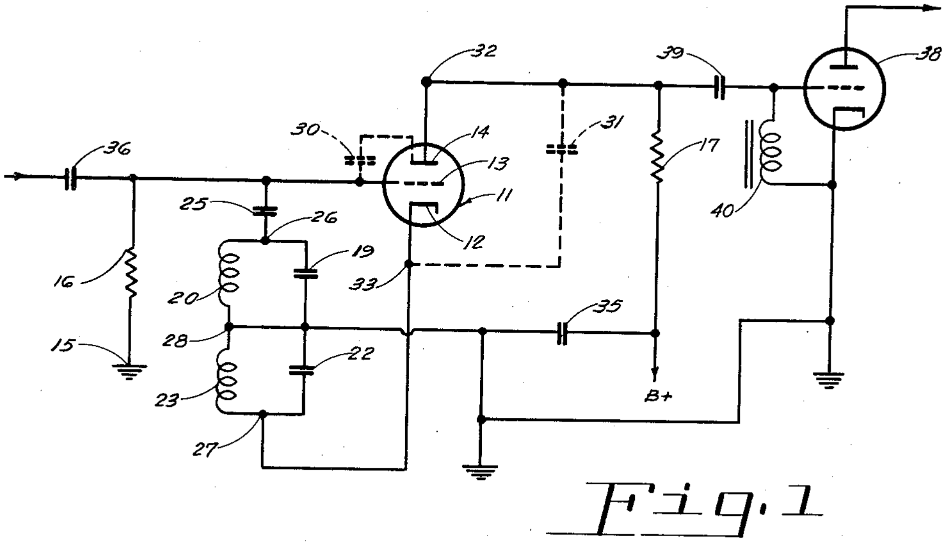

The present invention relates generally to oscillation generators, particularly to radio frequency oscillators, and specifically to a novel local oscillator of the type employed in radio and television receivers. My novel oscillator is particularly suitable for television use.

The primary object of the invention is to provide an oscillator circuit which is associated with one electron tube, for example a triode, in such a manner that the oscillator tube may simultaneously function as a mixer or frequency-changing tube or converter.

Another object is to provide an oscillator circuit including a single tube which may be associated with a radio frequency input and other components to provide a plate circuit intermediate frequency output.

Other objects are to provide an economically constructed oscillator of good stability which is tunable through a wide range.

For a better understanding of the present invention, together with other and further objects, advantages, and capabilities thereof, reference is made to the following description of the accompanying drawings.

Figure 2:
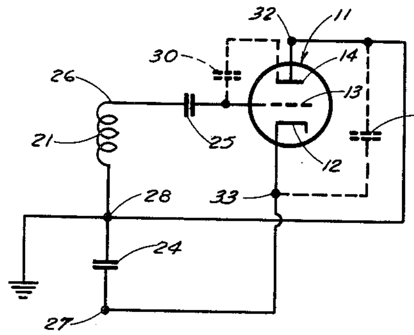
Figure 3:
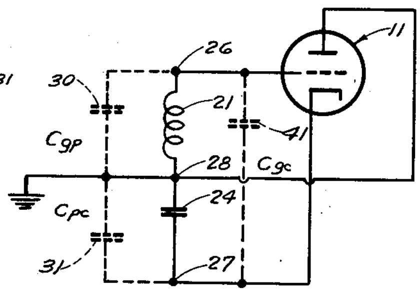
Figure 4:
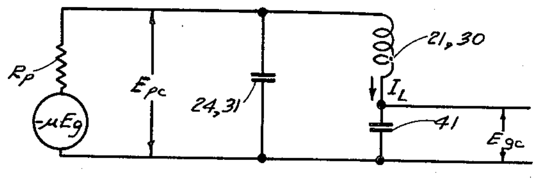
Figure 5:
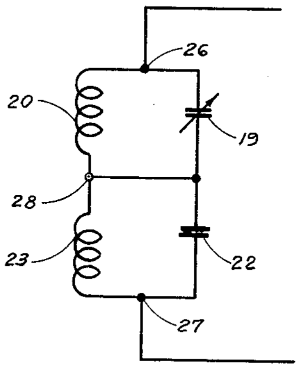
Figure 6:
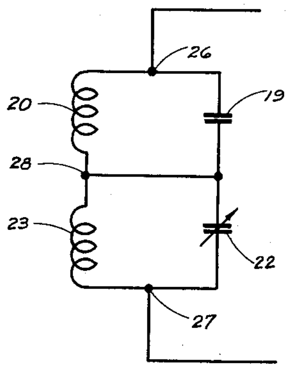
Figure 7:
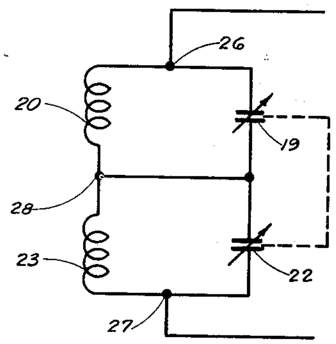
Figure 8:
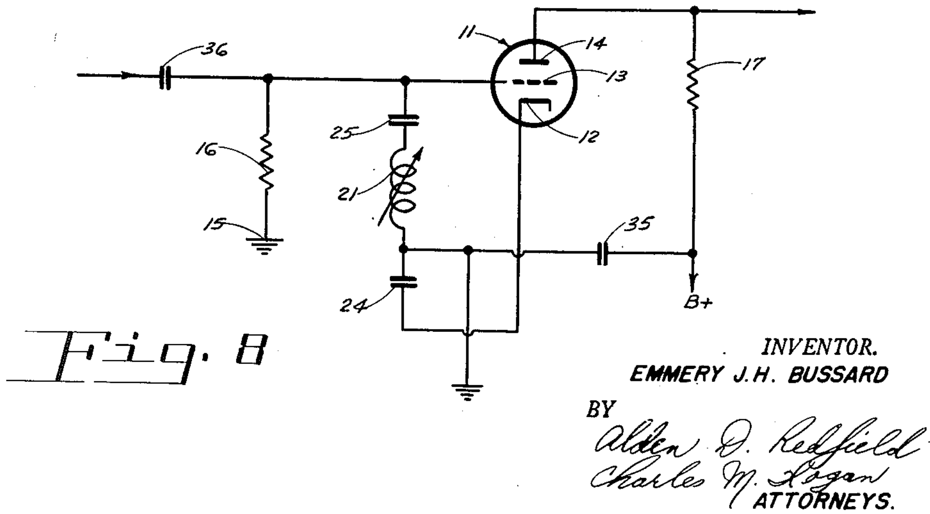

In the drawings:

Fig. 1 is an oscillator-modulator circuit including an oscillator in accordance with the present invention;

Figs. 2, 3, and 4 are radio frequency equivalent circuit diagrams of the Fig. 1 oscillator, greatly simplified;

Figs. 5, 6, and 7 illustrate suitable arrangements for tuning the Fig. 1 oscillator through a wide range; and Fig. 8 is an alternative form of oscillator, in accordance with certain generic concepts of the invention.

In Fig. 1 there is shown a triode tube 11 having a cathode 12, control electrode 13, and an anode 14. The control electrode and anode are commonly referred to in the art as "cold electrodes." Between grid and input terminal 15 (ground) is connected a grid bias resistor 16. The anode is connected to a source of space current (not shown), the positive terminal of which is symbolized by +B, through a load resistor 17.

The oscillator includes a grid tank circuit comprising a parallel combination of a capacitor 19 and an inductor 20, connected between grid 13 and ground. This tank circuit is tuned to a frequency slightly above the local oscillation output frequency, so that it is inductive and, under each condition of operation, is therefore equivalent to an inductance 21 (Figs. 2, 3, and 4). It will be understood, therefore, that the inductor 21 of Figs. 2 and 3 represents, at a particular frequency setting of the oscillator, the R. F. equivalent of the elements 19 and 20 (Fig. 1). The oscillator also includes a cathode tank circuit comprising a parallel combination of a capacitor 22 and an inductor 23, connected between cathode 12 and ground. The cathode tank circuit is tuned to a frequency slightly below the local oscillation output frequency, so that this tank circuit is capacitive and, under each condition of operation, is equivalent to a capacitance 24 (Figs. 2, 3, and 4). The capacitor 24, then, shown in Figs. 2 and 3, represents the equivalent of the elements 22, 23 in Fig. 1 for a given frequency setting of the oscillator.

In the Fig. 1 embodiment a capacitor 25 is interposed in circuit between the grid tank and control electrode 13.

The grid resistor 16 and the capacitor 25 serve as a conventional arrangement for self-biasing the control electrode of tube 11 by grid rectification.

The radio frequency circuit between plate and cathode is completed by the interelectrode capacitance 31. This capacitance may be augmented by a parallel capacitance, when desired. A filter capacitor 35 is connected between ground and the junction of load resistor 17 with the +B supply line.

The oscillator herein shown is incorporated in an oscillator-modulator stage. The received radio frequency carrier signals are applied to the input circuit of frequency-changing tube 11 by a network comprising a coupling capacitor 36 and grid resistor 16. The intermediate frequency output signals are taken from the plate circuit of tube 11 and applied to the input of an intermediate frequency amplifier tube 38 by a coupling network comprising capacitor 39 and inductor 40, the cathode of tube 38 being grounded and the inductor 40 being connected between its grid and ground.

Referring now to Figs. 2 and 3 and proceeding to a discussion of the operation of my novel oscillator, it will be observed (Fig. 2) that for radio frequency signals the plate is effectively grounded, and the following parameters enter into the circuit operation: the interelectrode and distributed capacitance 31 between plate and cathode ($C_{PC}$), the interelectrode and distributed capacitance 41 between grid and cathode ($C_{GC}$), and the interelectrode capacitance 30 between grid and plate ($C_{GP}$).

Referring now to Fig. 3, the grid-plate capacitance 30 is effectively in parallel with inductor 21, the plate being grounded, and is so indicated by the reference numeral 30. The plate-cathode capacitance is effectively in parallel with the capacitor 24 and is so indicated by the reference numeral 31. The grid-cathode capacitance 41 is effectively in parallel with the series combination of capacitances 30 and 31. This will be apparent from an inspection of Fig. 2, wherein there is shown a series combination of capacitances 30 and 31 between grid and cathode of tube 11. The parameter 41 also exists between the grid and cathode. The capacitor 25 is not a substantial frequency-determining parameter and is therefore omitted from the Fig. 3 R. F. equivalent circuit of my novel oscillator.

For purposes of explaining the operation of an oscillator in accordance with the invention, certain assumptions will be made for purposes of simplification and clarification: (1) That the plate voltage supply has infinite reactance; (2) That the grid condenser 25 has negligible reactance; (3) That the grid current is negligibly small; and (4) That the resistance of grid leak 16 is infinitely large.

The tank circuit resistance and coupled load resistance are also disregarded for purposes of this discussion. Let it be assumed, referring now to Fig. 4, that the tank circuit load on the anode of tube 11 approximates a resistance at resonance. The voltage $E_{PC}$ across the tank circuit is then approximately 180 degrees out of phase with the applied voltage $E_{GC}$. Current $I_L$ is drawn through the inductive branch of a tuned circuit, which tuned circuit in effect comprises two branches: (1) a capacitive branch consisting of the effective capacitance between plate and cathode, primarily determined by elements 24 and 31; and (2) an inductive branch consisting of the effective inductance of the parallel combination of in-inductor 21 and capacitance 30, and the grid-cathode capacitance 41. This current through the inductive branch lags $E_{PC}$ by an angle approximating 90 degrees. This current through 21, 30 also flows through the capacitor 41 and produces a feedback voltage $E_{GC}$ which lags $I_L$ by 90 degrees and is applied to the grid of tube 11 approximately in 180 degrees phase relationship to the R. F. plate voltage thereof. Proper phase of the feedback voltage requires that the effective plate-to-cathode and grid-to-cathode reactances be of the same sense. The grid-to-cathode reactance is capacitive, in the particular embodiment shown, and accordingly the combined reactance of the plate-to-cathode elements 24 and 31 is capacitive. It is of the essence that a frequency-determining network include an inductance, and therefore I provide a parallel combination of inductor 21 and capacitance 30 which has inductive reactance.

It will be apparent from the foregoing analysis that in lieu of the combination of elements 19 and 20 shown in Fig. 1 there may be substituted a single lumped inductance. Additionally, in lieu of the combination of elements 23 and 22 there may be substituted a single capacitor. These substitutions are shown in Fig. 8 and are made within the generic scope of the invention. A circuit so constructed would be suitable for narrow band operation but would not be suitable for incorporation in an oscillator-modulator circuit of the type shown in Fig. 1, the latter circuit always maintaining a high impedance between points 26 and 28 and between points 28 and 27 in order to avoid shunting of the input of tube 11 with respect to the applied carrier frequency signals.

In Figs. 5, 6, and 7 there are shown various arrangements by which the Fig. 1 oscillator may be tuned through a wide range. In the Fig. 5 showing the capacitor 19 is varied for frequency adjustment. In Fig. 6 the capacitor 22 is varied. In Fig. 7 capacitors 19 and 22 are varied in unison, they being shown as ganged and appropriately shaped for that purpose.

While there have been shown and described what are at present believed to be the preferred embodiments of the invention, it will be obvious to those skilled in the art that various modifications and substitutions of equivalents may be made therein without departing from the true scope of the appended claims. For example, the operating frequency of my novel oscillator may be adjusted by variation of one of the tank inductors as well as by the capacitance varying expedients illustrated in Figs. 5, 6, and 7, as will be obvious to those skilled in the art. However, for purposes of disclosing this alternative in the drawings, the inductor or effective inductance illustrated in Fig. 8 has an arrow symbolically marked thereon to suggest that it may be variable. Additionally, while the description of the Fig. 1 embodiment, for example, develops that the cathode tank circuit thereof is capacitive and that the grid tank circuit thereof is inductive, I have experimentally ascertained that these characteristics may be reversed so that the grid circuit tank may be capacitive and the cathode circuit tank inductive. It is intended in the appended claims to cover such modifications and substitutions.

Having thus described my invention, I claim:

1. In an oscillation generator, the combination of an electron tube including at least an anode, a control electrode and a cathode, a common terminal, means for radio-frequency-connecting said anode to said terminal, a series combination of a capacitor and an inductively reactive parallel combination of inductance and capacitance between said terminal and said control electrode, and a capacitively reactive parallel combination of inductance and capacitance between said terminal and said cathode.

2. An oscillation generator comprising an electron tube including at least an anode, a control electrode and a cathode, a common ground terminal, means for radio-frequency-connecting said anode to said terminal, a series combination of a capacitor and an inductively reactive tank circuit comprising parallel inductance and capacitance between said terminal and said control electrode, and a capacitively reactive tank circuit comprising inductance and capacitance between said terminal and said cathode, said generator having an output frequency lying between the natural frequencies of said tank circuits.

3. An oscillation generator comprising an electron tube including at least an anode, a control electrode and a cathode, a common terminal, means including a load impedance and a capacitor for radio-frequency-connecting said anode to said terminal, a series combination of a capacitor and a reactive tank circuit between said terminal and said control electrode, another reactive tank circuit of opposite sense between said terminal and said cathode, and means for self-biasing said control electrode.

4. An oscillation generator comprising an electron tube including at least an anode, a control electrode and a cathode, a common terminal, means including a load impedance and a capacitor for radio-frequency-connecting said anode to said terminal, a series combination of a capacitor and a reactive tank circuit between said terminal and said control electrode, another reactive tank circuit of opposite sense between said terminal and said cathode, the capacitor in said series combination being connected between the first-mentioned tank circuit and said control electrode, and a grid resistor.

5. An oscillation generator comprising an electron tube including at least an anode, a control electrode and a cathode, said anode and control electrode being cold electrodes, a common terminal, means for radio-frequency-connecting one of said cold electrodes to said terminal, a reactance between said terminal and the other one of said cold electrodes, another reactance of opposite sense between said terminal and said cathode, said reactances collectively constituting a series inductance-capacitance combination in circuit between said cathode and the last-mentioned cold electrode.

EMMERY J. H. BUSSARD.

REFERENCES CITED

The following references are of record in the file of this patent:

UNITED STATES PATENTS

| Number | Name | Date |
|---|---|---|
| 2,026,874 | Eitel et al. | Jan. 7, 1936 |

FOREIGN PATENTS

| Number | Country | Date |
|---|---|---|
| 461,983 | Great Britain | Mar. 1, 1937 |
| 576,460 | Great Britain | Apr. 4, 1946 |